(12) United States Patent
Lee et al.

(10) Patent No.: US 6,251,803 B1
(45) Date of Patent: Jun. 26, 2001

(54) METHOD FOR FORMING A TITANIUM DIOXIDE LAYER

(75) Inventors: Ming-Kwei Lee; Hsin-Chih Liao, both of Kaohsiung (TW)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 09/366,820

(22) Filed: Aug. 4, 1999

Related U.S. Application Data

(63) Continuation-in-part of application No. 09/306,080, filed on May 6, 1999.

(30) Foreign Application Priority Data

Apr. 1, 1999 (TW) .......................................... 87116110A01

(51) Int. Cl.[7] .......................... H01L 21/31; H01L 21/469
(52) U.S. Cl. .......................... 438/778; 438/240; 438/758; 438/763; 438/781; 427/126.3; 428/432
(58) Field of Search .................................... 438/240, 609, 438/610, 758, 763, 781, 785, 778, 432; 427/126.3

(56) References Cited

U.S. PATENT DOCUMENTS 5,811,192 * 9/1998 Takahama et al. ................... 428/432
6,066,359 * 5/2000 Yao et al. .......................... 427/126.3

* cited by examiner

*Primary Examiner*—Charles Bowers
*Assistant Examiner*—Asok Kumar Saricar
(74) *Attorney, Agent, or Firm*—Madson & Metclaf

(57) ABSTRACT

A method for forming a titanium dioxide layer is disclosed. The method includes the steps of providing a titanium-containing material, adding hydrogen chloride and nitric acid to the titanium-containing material to form a mixture, and exposing the device to the mixture to form the titanium dioxide layer thereon. Not only can the refractive index of the titanium dioxide layer formed by this method be increased, but also its growth rate and stability will be enhanced to be applied in the production line. Such a method can be applied for forming a titanium dioxide layer on a semiconductor device, a silicon substrate, an integrated circuit, a photoelectric device, etc.

20 Claims, 6 Drawing Sheets

METHOD FOR FORMING A TITANIUM DIOXIDE LAYER

FIELD OF THE INVENTION

The present invention is a continuation-in-part application of the parent application bearing Ser. No. 09/306,080 and filed on May 6, 1999. The present invention is related to a method for forming a titanium dioxide layer.

BACKGROUND OF THE INVENTION

Generally, in the manufacturing processes for integrated circuits, semiconductor devices, and photoelectric devices, a titanium dioxide film has been extensively used. Titanium dioxide can be applied in a memory with a high capacity (such as dynamic random access memory (DRAM)) because of its higher dielectric constant, or can be applied in photoelectric devices (for example, waveguide, filter, antireflective coating, etc.) due to its high refractive index.

The most commonly used method for forming a titanium dioxide includes: (1) reactive sputtering; (2) sol-gel growing method which is performed at 800° C.; (3) plasma enhanced chemical vapor deposition which is executed at less than 400° C. However, high radiation generated in the sputtering process will damage the device. Moreover, high temperature required for the reactive sputtering process or sol-gel growing method also causes a damage to the fabricated device. If titanium dioxide can be grown at a lower temperature, the damage resulting from radiation and high temperature can be avoided.

Liquid phase deposition (LPD) is a method of forming a film at about room temperature so that this method has a great developing potential in the processes for manufacturing integrated circuits, semiconductor devices, and photoelectric devices.

In the previous studies about forming titanium dioxide film by liquid phase deposition, not only is the coverage of the formed titanium dioxide film not so good, but a few changes of the operating parameters will significantly influence the growth quality because of too slow deposition rate (less than 6 Å/min) and unstable growth. Therefore, the titanium dioxide film formed by the prior technique can not be applied in the production line due to low throughput and unstable quality.

Our previous U.S. patent application Ser. No. 09/306,080 discloses a method to solve the above-described problems. This method is characterized by that nitric acid is added to the raw material $H_2TiF_6$ for increasing the growth rate of the titanium dioxide layer and enhancing its stability. However, the current leakage of the formed titanium dioxide layer is still not low enough and there still exists some space to improve its quality.

SUMMARY OF THE INVENTION

An object of the present invention is to provide a method for forming a titanium dioxide layer on a device.

Another object of the present invention is to provide a method for forming a titanium dioxide layer by liquid phase deposition to improve the quality of titanium dioxide layer and effectively avoid the occurrence of current leakage.

Another yet object of the present invention is to provide a method for forming a titanium dioxide layer which can greatly increase the deposition rate of the titanium dioxide layer.

The method includes the steps of providing a titanium-containing material, adding hydrogen chloride and nitric acid to the titanium-containing material to obtain a mixture, and exposing the device to the mixture to form the titanium dioxide layer thereon Preferably, the titanium-containing material is $H_2TiF_6$. The concentration of the titanium-containing material ranges from 0.1M to 6.1M.

Preferably, the concentration of hydrogen chloride ranges from 0.001M to 0.1M and the concentration of nitric acid ranges from 0.1M to 0.5M.

The suitable device can be a semiconductor device, a silicon substrate, an integrated circuit, or a photoelectric device.

In accordance with one aspect of the present invention, the titanium dioxide layer is formed by a liquid phase deposition which is performed preferably at a temperature ranging between 20° C. to 80° C. for 2 to 30 minutes.

The forming rate and the refractive index of the titanium dioxide layer are controlled by the volume or concentration of hydrogen chloride.

The current leakage of the titanium dioxide layer can be controlled by the volume or concentration of hydrogen chloride.

The flat-band voltage shift and the effective oxide charge of the titanium dioxide layer are controlled by the volume or concentration of hydrogen chloride.

Another further object of the present invention is to provide a method for forming a titanium dioxide layer on a semiconductor device. The method includes the steps of cleaning the semiconductor device (e.g. a silicon substrate), providing a titanium-containing material and adding an acid substance to the titanium-containing material to obtain a mixture, and exposing the cleaned semiconductor device to the mixture to form the titanium dioxide layer thereon.

The present invention may best be understood through the following description with reference to the accompanying drawings, in which:

DETAILED DESCRIPTION OF THE PREFERRED EMBODIMENT

Figure 1:
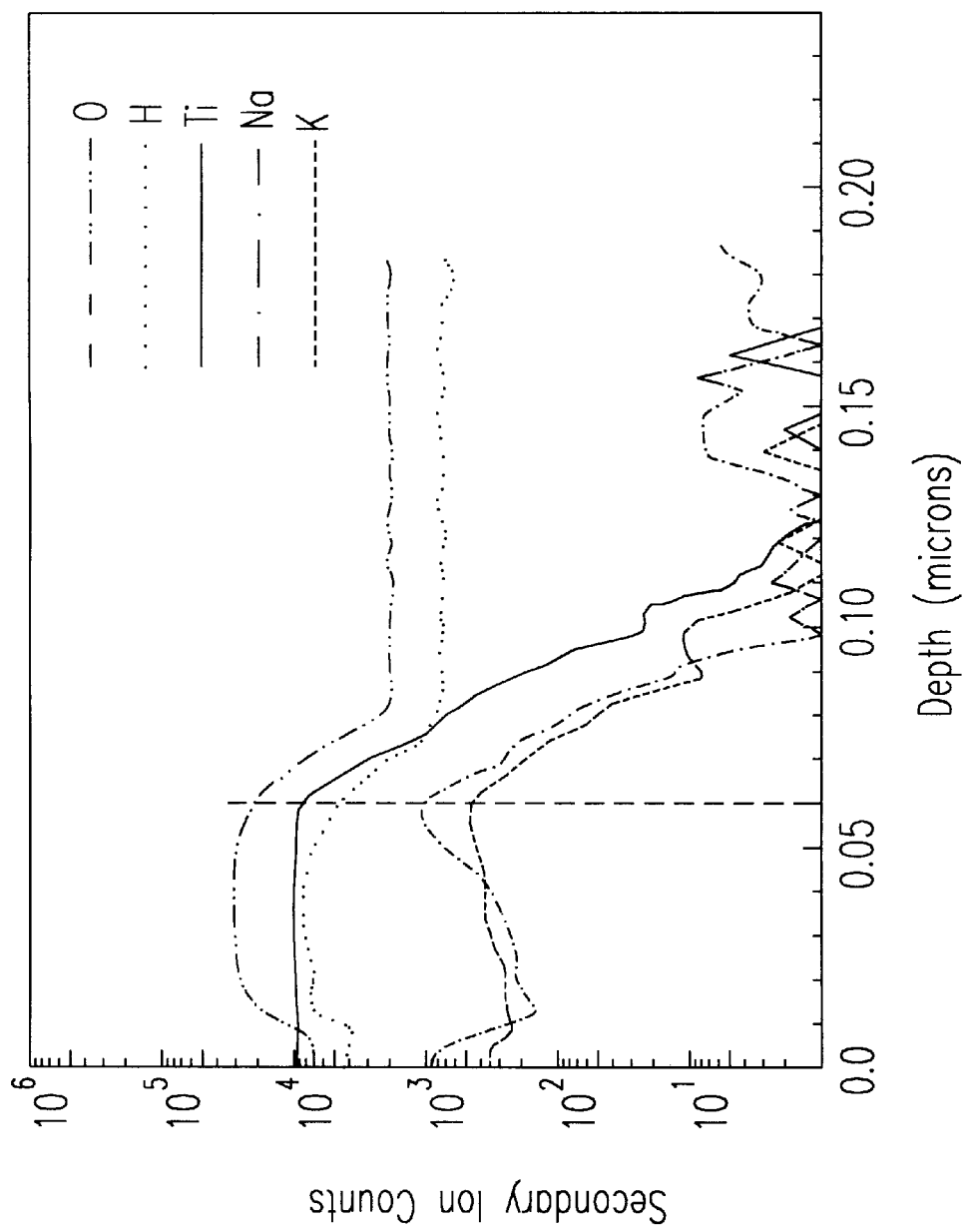
FIG. 1 is a secondary ion mass spectroscopy (SIMS) depth profile of the titanium dioxide layer formed according to the method of the present invention.

The present invention will now be described more detailedly with reference to the following embodiments. It is to be noted that the following descriptions of the preferred embodiments of this invention are presented herein for the purpose of illustration and description only. It is not intended to be exhaustive or to be limited to the precise form disclosed.

The present invention provides a method for forming a titanium dioxide layer on a device, which is characterized by that nitric acid and hydrogen chloride are added to the raw material $H_2TiF_6$ for increasing the deposition rate of titanium dioxide layer and improving its quality. Because nitrous acid is often contained in nitric acid solution, both of them will spontaneously react with each other to provide a great number of electron holes so that elemental titanium can be reduced from the raw material $H_2TiF_6$ and accepts the electron hole provided by nitric acid to form titanium ion and then to become titanium dioxide.

In order to further understand the present invention, the principle is detailedly described as follows.

Typically, the reaction equations of forming titanium dioxide by liquid phase deposition are as follows:

$$H_2TiF_6 + 2H_2O \leftrightarrow TiO_2 + 6HF \quad (1)$$

$$H_3BO_3 + 4HF \leftrightarrow BF^- + H_3O^+ + 2H_2O \quad (2)$$

By the above-described reactions, its growth rate is less than 6 Å/min, which is not suitable to be applied in the production line. Therefore, the present invention develops an improved method, that is, adding nitric acid to the raw material $H_2TiF_6$ for facilitating its growth rate. Its principle is described in detail as follows.

After analyzing the reaction equations (1) and (2), it is found that titanium is dissociated from the solution of $H_2TiF_6$, accepts the electron hole to form a titanium ion, and is then reacted with hydroxide ion in water to generate titanium hydroxide. Finally, the dehydration is performed to generate titanium dioxide and hydrogen. The reaction equations are as follows:

$$Ti + 2H^+ \rightarrow Ti^{2+} \quad (3)$$

$$Ti^{2+} + 2OH^- \rightarrow Ti(OH)_2 \quad (4)$$

$$Ti(OH)_2 \rightarrow TiO_2 + 2H_2 \quad (5)$$

Taking a semiconductor silicon substrate as an example, there is a charge exchange between silicon and the electrolyte due to the chemical potential difference between silicon and the electrolyte, resulting in that the surface of silicon substrate lacks electron (i.e. silicon provides electron holes on the surface of silicon substrate) to generate a situation of Eq. (3). Hydroxide ion of Eq. (4) is dissociated from water. If water is provided sufficiently (i.e. the amount of hydroxide ion is sufficient), Eq. (4) can be performed quickly. Therefore, the bottleneck of overall reaction is the supplement of electron holes, that is, Eq. (3). If the electron holes can be supplied fully in the entire reaction, the reaction rate can be increased.

Because nitrous acid is often contained in nitric acid solution, both of them will spontaneously react with each other to provide a great number of electron holes as described in following reaction equations:

$$HNO_3 + HNO_2 \rightarrow N_2O_4 + 2H_2O \quad (6)$$

$$N_2O_4 \leftrightarrow 2NO_2 \quad (7)$$

$$2NO_2 \leftrightarrow 2NO_2^- + 2H^+ \quad (8)$$

$$2NO_2^- + 2H^+ \leftrightarrow 2HNO_2 \quad (9)$$

From Eq. (8), it is found that the electron holes can be generated in the solution after adding nitric acid therein. Because the number of electron holes is proportional to the concentration of nitric acid, Eq. (3) can be performed quickly, that is, the growth rate of titanium dioxide can be greatly increased.

However, due to the contamination in the raw material and environment, some sodium or potassium ions are contained in the titanium dioxide layer, which is the main reason why the current leakage occurs. In order to solve this problem, hydrogen chloride is added in the reaction solution according to the present invention, wherein hydrogen chloride in the solution will be dissociated to $H^+$ and $Cl^-$ to increase the concentration of hydrogen ions in the growth solution and promote the reaction of Eq. (9) so that Eq. (8) is quickly performed from left to right to increase the amount of electronic holes. As described above, if the electronic holes are sufficiently supplied, the reaction can be accelerated and the deposition rate of the titanium dioxide film is increased as well.

In addition, after hydrogen chloride is dissociated to $H^+$ and $Cl^-$, $Cl^-$ will react with sodium or potassium ion in the solution to form sodium chloride or potassium chloride which can easily segregate from the film or cause a gettering effect in the film. Therefore, the concentration of sodium or potassium ions in the titanium dioxide film can be reduced effectively, thereby reducing the occurrence of current leakage of the film. Because HCl is added to effectively separate or aggregate sodium or potassium ion, the stacking fault in the film can be reduced, the titanium dioxide film becomes denser, and the refractive index can also be increased.

In one preferred embodiment of the present invention, 0.5 ml, 0.2 M nitric acid is added to 20 ml, 6.1 M $H_2TiF_6$ to form a mixture called as an original solution. Then, 1 ml and 2 ml 0.05M HCl are respectively added to the original solution and the solution without adding HCl is used as a control group. Finally, the precleaned semiconductor device is respectively immersed in these three samples and measured for realizing the basic property (e.g. thickness, refractive index, etc.) and the electricity (e.g. I-V, C-V, etc.) of the formed titanium dioxide film.

From FIG. 1, it is found that sodium or potassium ions in the titanium dioxide film come from the extraneous material in the solution and the pollution of environment and result in current leakage. If sodium or potassium ions in the titanium dioxide film can be eliminated, the current leakage can be properly improved.

Figure 2:
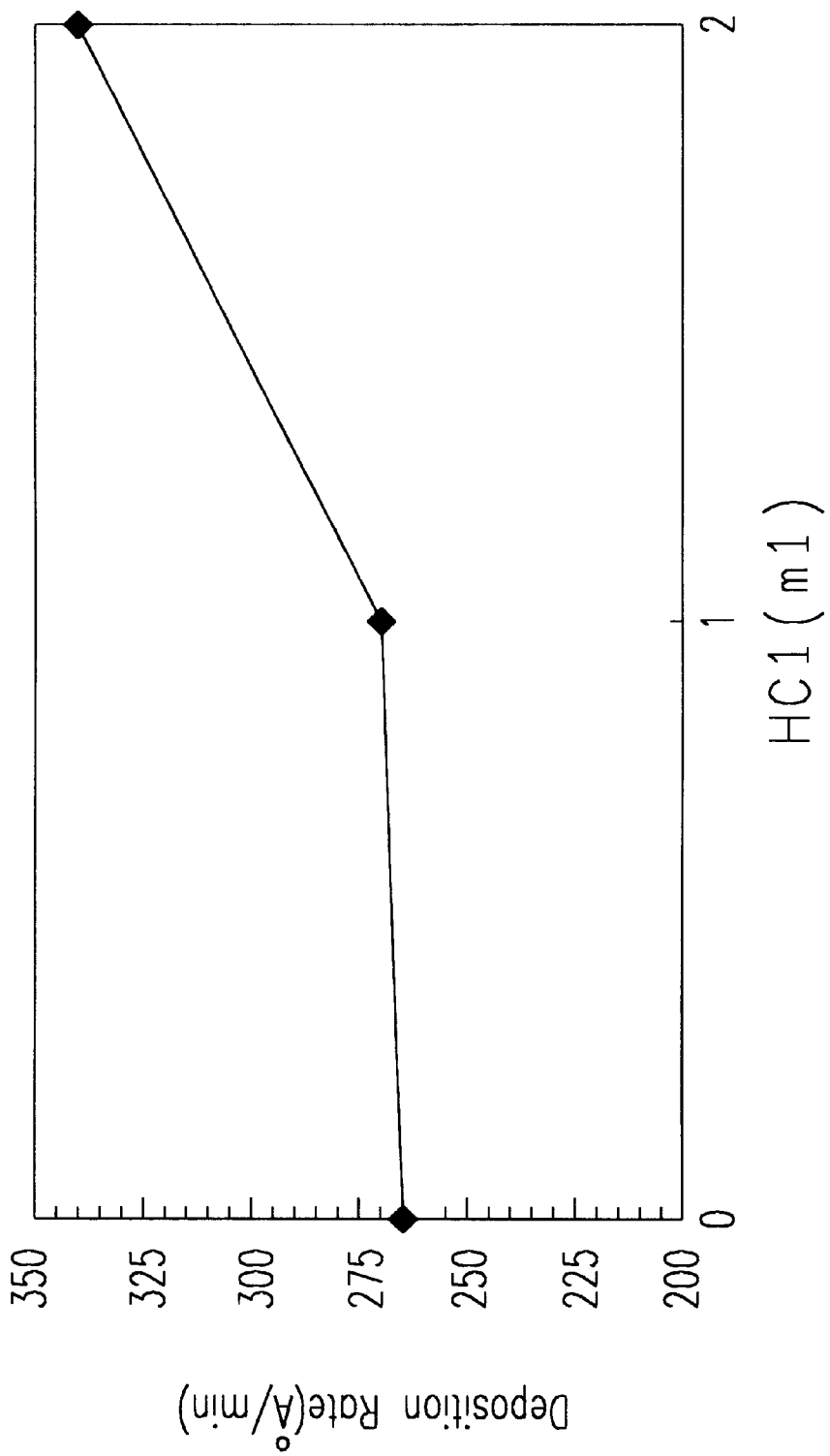
FIG. 2 is a graph showing the relationship between the volume of hydrogen chloride and the deposition rate of the titanium dioxide layer in the present invention.

Please refer to FIG. 2 showing the relationship between the volume of hydrogen chloride and the deposition rate of the titanium dioxide layer in these three samples. From this figure, it can be seen that the deposition rate of the titanium dioxide film is increased from 265 Å/min (without adding HCl) to 341 Å/min (adding 2 ml HCl). Thus, hydrogen ion dissociated from HCl solution really enhances the deposition rate of the titanium dioxide film.

Figure 3:
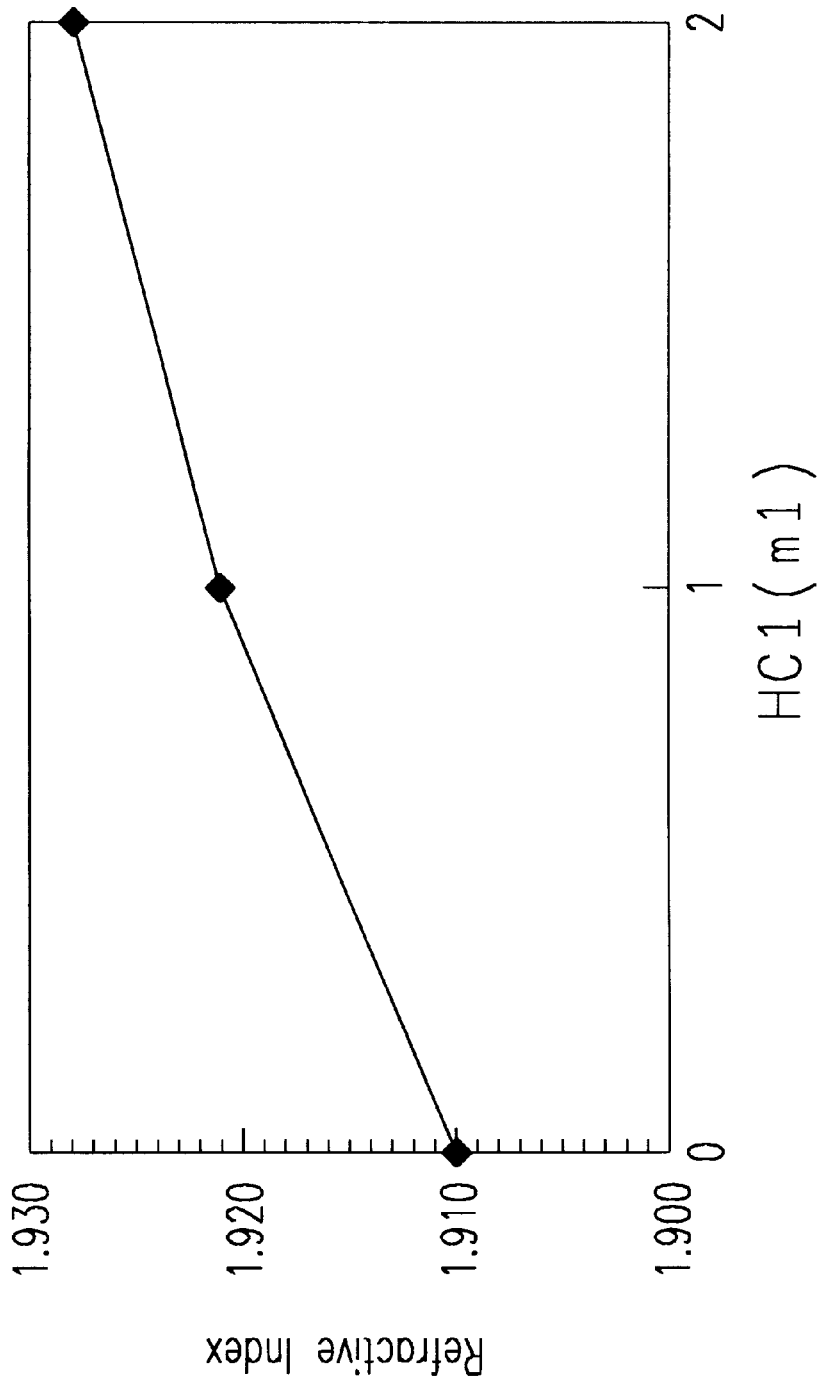
FIG. 3 is a graph showing the relationship between the volume of hydrogen chloride and the refractive index of the titanium dioxide layer in the present invention.

FIG. 3 shows the relationship between the volume of hydrogen chloride and the refractive index of the titanium dioxide layer in these three samples. It can be observed from FIG. 3 that the refractive index of the titanium dioxide film is increased from 1.910 (without adding HCl) to 1.928 (adding 2 ml HCl). Therefore, after adding HCl to the original solution, the titanium dioxide film becomes denser and the refractive index is also increased.

Figure 4A:
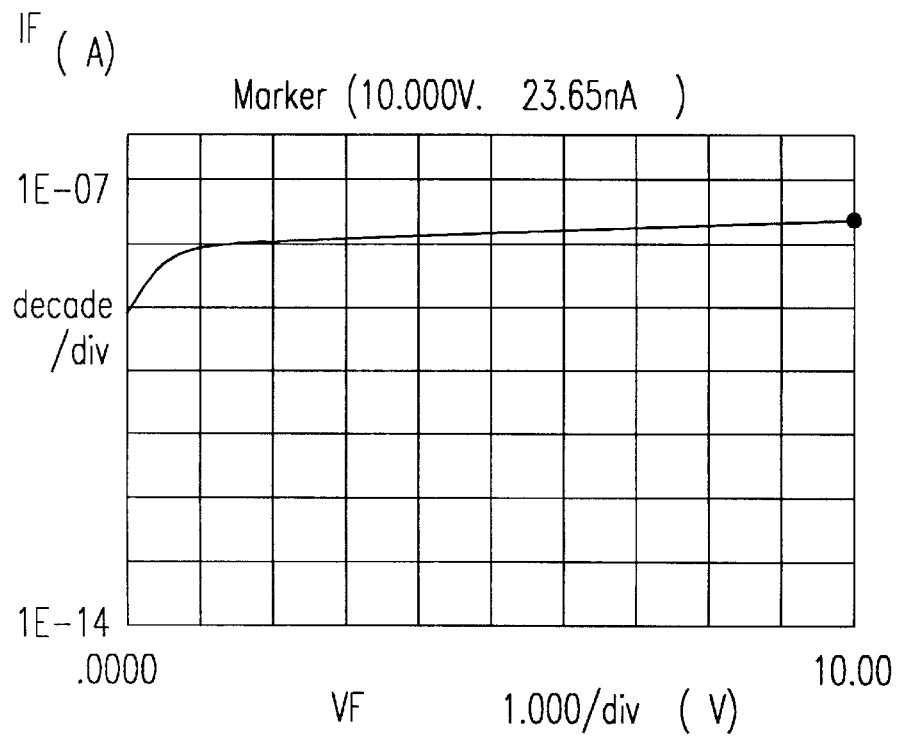
FIGS. 4(a)–4(c) are graphs respectively showing the current (I) -voltage (V) relationship of three samples: (a) without adding HCl solution; (b) adding 1 ml HCl solution; and (c) adding 2 ml HCl solution.
Figure 4B:
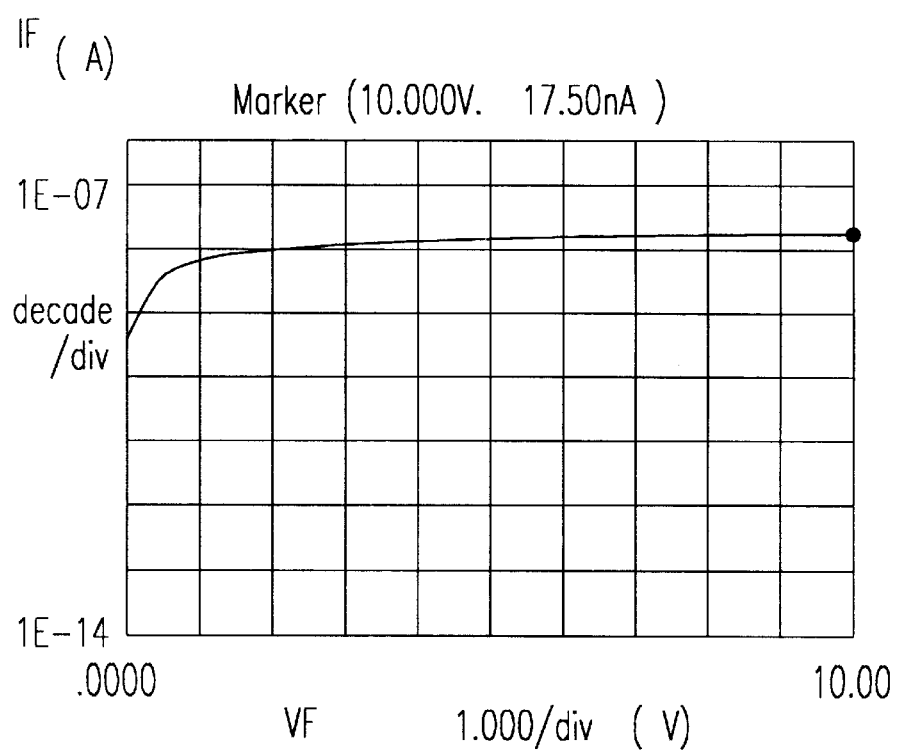
Figure 4C:
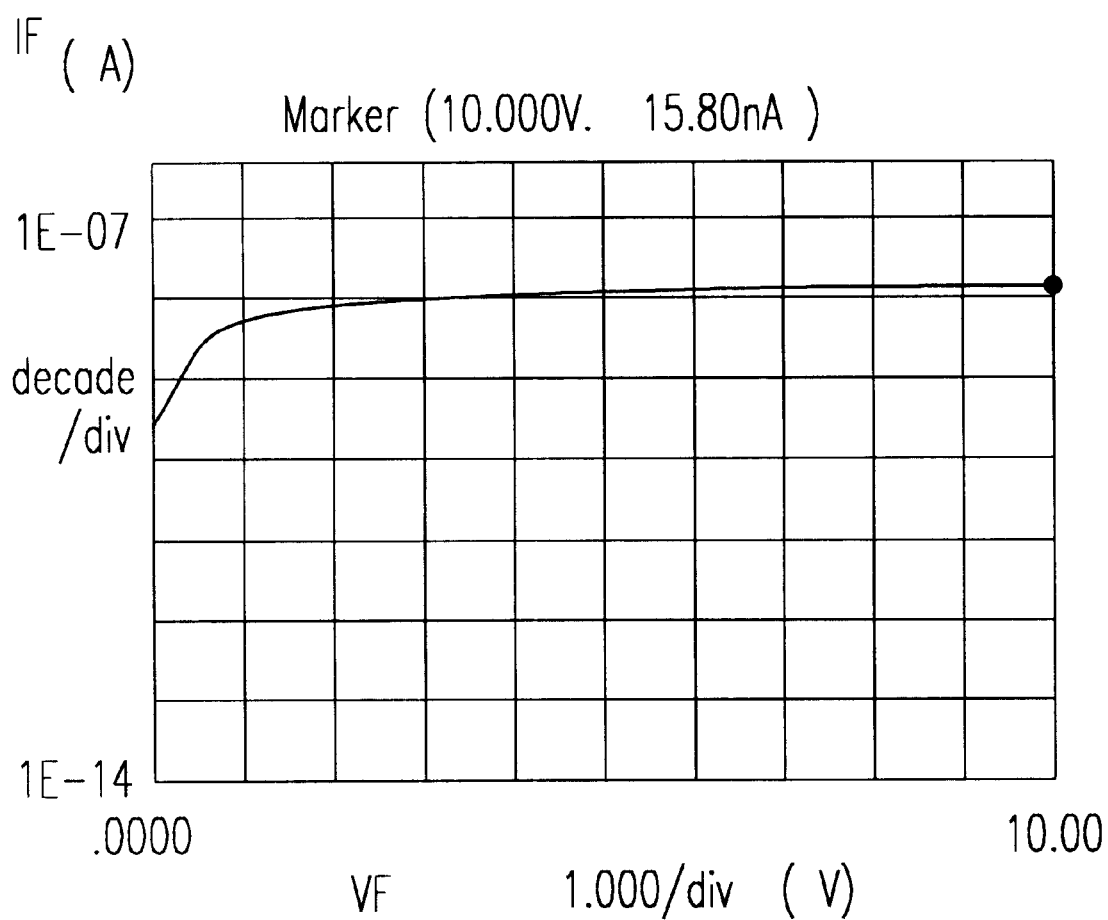

FIGS. 4(a)–4(c) respectively show the current(I)-voltage (V) relationship of three samples: (a) without adding HCl solution, (b) adding 1 ml HCl solution, and (c) adding 1 ml HCl solution. Based on the metal contact area of $7.85\times10^{-3}$ cm$^2$, it is found that the current leakage is reduced from 23.65 nA (as shown in FIG. 4(a)) to 15.8 nA (as shown in FIG. 4(c)). These results demonstrate that the addition of HCl really reduces the current leak(age of the titanium dioxide film.

Figure 5:
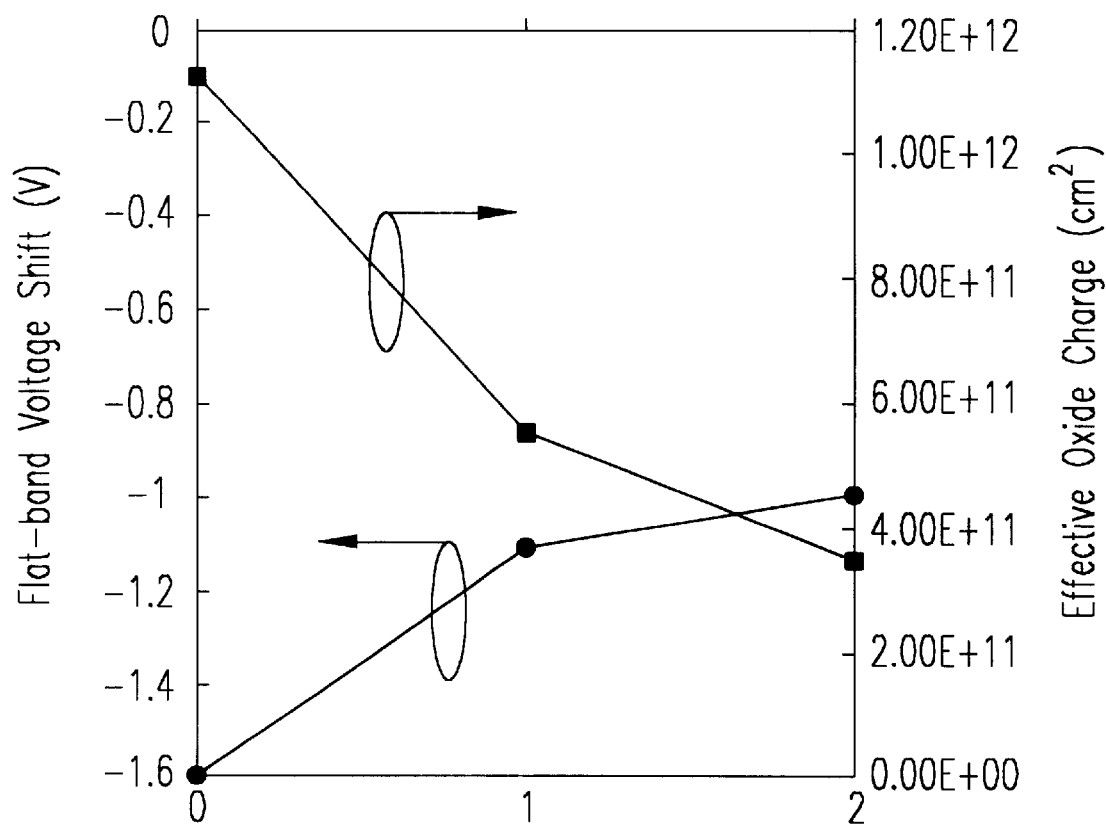
FIG. 5 is a graph of the flat-band voltage shift and effective oxide charge of three above-described samples of FIGS. 4(a)–(c) versus the volume of hydrogen chloride.

FIG. 5 is a graph of the flat-band voltage shift and effective oxide charge of these three samples. From this figure, it can be observed that the flat-band voltage shift is increased from −1.6 V (without adding HCl) to −1 V (adding 2 ml HCl). A negative flat-band voltage shift means that there are positive charges, such as sodium or potassium ions, contained in the titanium dioxide film. Moreover, the effective oxide charge is reduced from $1.09\times10^{12}$ cm$^{-2}$ to $3.5\times10^{11}$ cm$^2$.

To sum up the above-described results, the deposition rate, refractive index, current leakage, flat-band voltage shift, and effective oxide charge of the titanium dioxide layer can be effectively controlled by the volume or concentration of hydrogen chloride. Moreover, according to this method of forming the titanium dioxide layer by liquid phase deposition, the addition of hydrogen chloride can greatly improve the quality of the formed titanium dioxide layer and effectively avoid the occurrence of current leakage.

Certainly, all conditions, including the concentration and volume of hydrofluotitanic acid, the concentration and volume of nitric acid, the concentration and volume of hydrogen chloride, used in the above-described examples are not limited, because these parameters can be adjusted according to a variety of the desired devices (e.g. a semiconductor device, a silicon substrate, an integrated circuit, a photoelectric device, etc.) to obtain the best effect. According to the method of the present invention, not only will the refractive index of the titanium dioxide layer be increased, but its deposition rate and stability will be enhanced so as to be applied in the production line.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a titanum dioxide layer on a device, said device is one selected from a group consisting of a semiconductor device, a silicon substrate, an integrated circuit, and a photoelectric device, comprising:

providing a titanum-containing material;

adding hydrogen chloride and nitric acid to said titanum-containing material to form a mixture; and exposing said device to said mixture to form said titanium dioxide layer thereon.

2. The method according to claim 1 wherein said titanium-containing material is $H_2TiF_6$.

3. The method according to claim 2 wherein a concentration of titanium-containing material ranges from 2.0 M to 6.1 M.

4. The method according to claim 1 wherein a concentration of hydrogen chloride ranges from 0.001M to 2M.

5. The method according to claim 1 wherein a concentration of nitric acid ranges from 0.1 M to 0.5M.

6. The method according to claim 1 wherein said titanium dioxide layer is formed by a liquid phase deposition.

7. The method according to claim 1 wherein said titanium dioxide layer is formed at a temperature ranging from 20° C. to 80° C.

8. The method according to claim 1 wherein said device is exposed to said mixture for 2 to 30 minutes.

9. The method according to claim 1 wherein the forming rate and the refractive index of said titanium dioxide layer arc controlled by a volume of hydrogen chloride at a given concentration.

10. The method according to claim 1 wherein the current leakage of said titanium dioxide layer are controlled by a volume of hydrogen chloride at a given concentration.

11. The method according to claim 1 wherein the current leakage of said titanium dioxide layer is controlled by a concentration of hydrogen chloride.

12. The method according to claim 1 wherein the flat-band voltage shift and the effective oxide charge of said titanium dioxide layer arc controlled by a volume of hydrogen chloride at a given concentration.

13. The method according to claim 1 wherein the flat-band voltage shift and the effective oxide charge of said titanium dioxide layer are controlled by a concentration of hydrogen chloride.

14. A titanium dioxide layer formed by a method according to claim 1.

15. A method for forming a titanum dioxide layer on a device, comprising:

providing a titanum-containing material;

adding hydrogen chloride and nitric acid to said titanum-containing material to form a mixture; and exposing said device to said mixture to form said titanium dioxide layer thereon, wherein a forming rate and a refractive index of said titanium dioxide layer are controlled by a concentration of hydrogen chloride.

16. A method for forming a titanium dioxide layer on a semiconductor device, comprising:

cleaning said semiconductor device;

providing a titanium-containing material and adding hydrogen chloride and nitric acid to said titanium-containing material to obtain a mixture; and exposing said cleaned semiconductor device to said mixture to form said titanium dioxide layer thereon.

17. The method according to claim 16 wherein said semiconductor device is a silicon substrate.

18. The method according to claim 16, wherein a deposition rate of said titanium dioxide layer is at least 265 Å/min.

19. The method according to claim 16, wherein a deposition rate of said titanium dioxide layer is from 265 Å/min to 341 Å/min.

20. The method according to claim 16, wherein adding hydrogen chloride reduces a stacking fault and increases a density and a refractive index of said titanium dioxide layer.

* * * * *